(12) United States Patent
Yoshida

(10) Patent No.: US 8,189,413 B2
(45) Date of Patent: May 29, 2012

(54) SEMICONDUCTOR MEMORY DEVICE, TEST METHOD THEREOF AND SEMICONDUCTOR DEVICE

(75) Inventor: Soichiro Yoshida, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 202 days.

(21) Appl. No.: 12/549,184

(22) Filed: Aug. 27, 2009

(65) Prior Publication Data

US 2010/0054063 A1    Mar. 4, 2010

(30) Foreign Application Priority Data

Aug. 28, 2008    (JP) .................................. 2008-220570

(51) Int. Cl.
 *G11C 29/00*   (2006.01)
 *G11C 7/02*    (2006.01)
 *G11C 7/00*    (2006.01)
(52) U.S. Cl. .................... 365/201; 365/203; 365/207
(58) Field of Classification Search .................. None
 See application file for complete search history.

(56) References Cited

U.S. PATENT DOCUMENTS

| | | | |
|---|---|---|---|
| 5,561,626 A | 10/1996 | Fujii | |
| 5,701,269 A | 12/1997 | Fujii | |
| 5,828,594 A | 10/1998 | Fujii | |
| 7,120,043 B2 * | 10/2006 | Kang | 365/145 |
| 2005/0030817 A1 * | 2/2005 | Luk et al. | 365/226 |
| 2007/0223298 A1 * | 9/2007 | Barth et al. | 365/208 |

FOREIGN PATENT DOCUMENTS

| | | |
|---|---|---|
| JP | 10-512085 A | 11/1998 |
| JP | 2000-57761 A | 2/2000 |
| JP | 3521979 B2 | 4/2004 |
| JP | 3529534 B2 | 5/2004 |
| WO | 96/31882 A1 | 10/1996 |

* cited by examiner

*Primary Examiner* — Hoai V Ho
*Assistant Examiner* — James G Norman
(74) *Attorney, Agent, or Firm* — Sughrue Mion, PLLC

(57) ABSTRACT

A semiconductor memory device comprises a memory cell array having memory cells including a plurality of memory cells, and also comprises a first bit line, a first sense amplifier circuit and a control circuit. A signal is read out from a selected memory cell of the memory cell array through the first bit line. The first sense amplifier circuit has a single-ended configuration and includes an amplifying element amplifying a signal voltage of the first bit line so as to convert the signal voltage into an output current. The control circuit controls a test operation to measure a current flowing in the first sense amplifier circuit independently of currents flowing in other circuit portions.

10 Claims, 11 Drawing Sheets

SEMICONDUCTOR MEMORY DEVICE, TEST METHOD THEREOF AND SEMICONDUCTOR DEVICE

BACKGROUND OF THE INVENTION

1. Field of the Invention

The present invention relates to a semiconductor memory device having a memory cell array including a plurality of memory cells which store data and including a sense amplifier circuit amplifying a signal read out from a selected memory cell and transmitted through a bit line, and particularly relates to a semiconductor memory device performing a test to measure a threshold voltage of a MOS transistor included in the sense amplifier circuit, and to a test method thereof.

2. Description of Related Art

As capacity of semiconductor memory devices such as a DRAM has recently become large, a large number of memory cells connected to each bit line in a memory cell array have been required, and there arise a performance problem due to an increase in parasitic capacitance and parasitic resistance. As measures against such a problem, a configuration of the memory cell array having a hierarchical structure of bit lines has been proposed (Refer to, for example, Patent References 1 to 4). If such a hierarchical memory cell array is employed, the number of memory cells connected to the bit line can be suppressed by shortening the length of the bit lines and a configuration advantageous for reducing the parasitic capacitance and resistance can be achieved. Further, since the number of memory cells connected to the bit line is reduced, a single-ended sense amplifier circuit can be employed without using a differential sense amplifier circuit, thereby suppressing an increase in circuit scale.

Patent Reference 1: Japanese Patent Publication No. 3521979
Patent Reference 2: Japanese Patent Publication No. 3529534
Patent Reference 3: Published Japanese Translation No. H10-512085
Patent Reference 4: Japanese Patent Application Laid-open No. 2000-57761

Meanwhile, the single-ended sense amplifier circuit is generally configured to connect each bit line to a gate of a MOS transistor as an amplifying element so as to convert its output to a drain current, and thus is susceptible to fluctuation of a threshold voltage of the MOS transistor. For example, when the threshold voltage of the amplifying element of the sense amplifier circuit varies due to fluctuation of manufacturing process or the like, this causes a problem such as a decrease in operating margin. Thus, it is important to previously screen good products by obtaining threshold voltages of amplifying elements in the respective sense amplifier circuits in manufacturing process. To achieve this, an average value of the threshold voltages of the MOS transistors as the amplifying elements may be obtained for a large number of sense amplifier circuits, and it may be determined whether or not an individual threshold voltage of each amplifying element is appropriate with reference to the average value.

When employing the single-ended sense amplifier circuit, there are provided a large number of sense amplifier circuits corresponding to the number of bit lines arranged in the memory cell array. When a large capacity DRAM is tested, an average value of threshold voltages of the amplifying elements needs to be calculated as a reference for variation thereof for the large number of sense amplifier circuits. Even if, for example, the threshold voltages of the amplifying elements are obtained for one or several sense amplifier circuits, an accurate average value cannot be calculated. Meanwhile, when the threshold voltages of the amplifying elements are to be obtained for the large number of sense amplifier circuits, complex configuration and control are required and a practical test is difficult to perform. In this manner, there has been a problem of difficulty in performing the practical test for the DRAM having the large number of single-ended sense amplifier circuits in order to calculate the accurate average value of the threshold voltages of the amplifying elements.

SUMMARY

The present invention seeks to solve one or more of the above problems and provides a semiconductor memory device capable of obtaining an average value of threshold voltages of amplifying elements, which serves as a reference of fluctuation of the threshold voltages, for a large number of single-ended sense amplifier circuits by using simple configuration and control, and also provides a test method thereof.

An aspect of the invention is a semiconductor memory device comprising: a memory cell array including a plurality of memory cells; a first bit line through which a signal read out from a selected memory cell of the memory cell array is transmitted; a first sense amplifier circuit of single-ended configuration including an amplifying element amplifying a signal voltage of the first bit line so as to convert the signal voltage into an output current; and a control circuit controlling a test operation to measure a current flowing in the first sense amplifier circuit independently of currents flowing in other circuit portions.

According to the semiconductor memory device of the aspect, when performing a test operation, for example, N memory cells are selected, signals read out through N first bit lines are amplified by N first sense amplifier circuits, and a total current flowing at this point can be measured independently of currents flowing in other circuit portions. Thus, an average current flowing in amplifying elements is obtained from the measured current at this point, and thereby a reference for the variation of threshold voltages of the amplifying elements can be obtained. Accordingly, a distribution of threshold voltages of the amplifying elements can be determined for a large number of single-ended first sense amplifier circuits without complex configuration and control and without an increase in chip area, and thereby it is possible to appropriately screen good products.

As described above, according to the invention, the test operation in the semiconductor memory device is performed in which the current flowing in the plurality of first sense amplifier circuits can be measured independently of other currents, and an average current flowing in each of the plurality of first sense amplifier circuits can be obtained based on the measured current. Thus, a variation of threshold voltages of the amplifying elements can be easily determined for the single-ended first sense amplifier circuits, and good products can be appropriately determined in manufacturing them using simple configuration and control without an increase in chip area.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, two of the embodiments will be described, in which the present invention is applied to, for example, a DRAM (Dynamic Random Access Memory) as a semiconductor memory device.

First Embodiment

Figure 1:
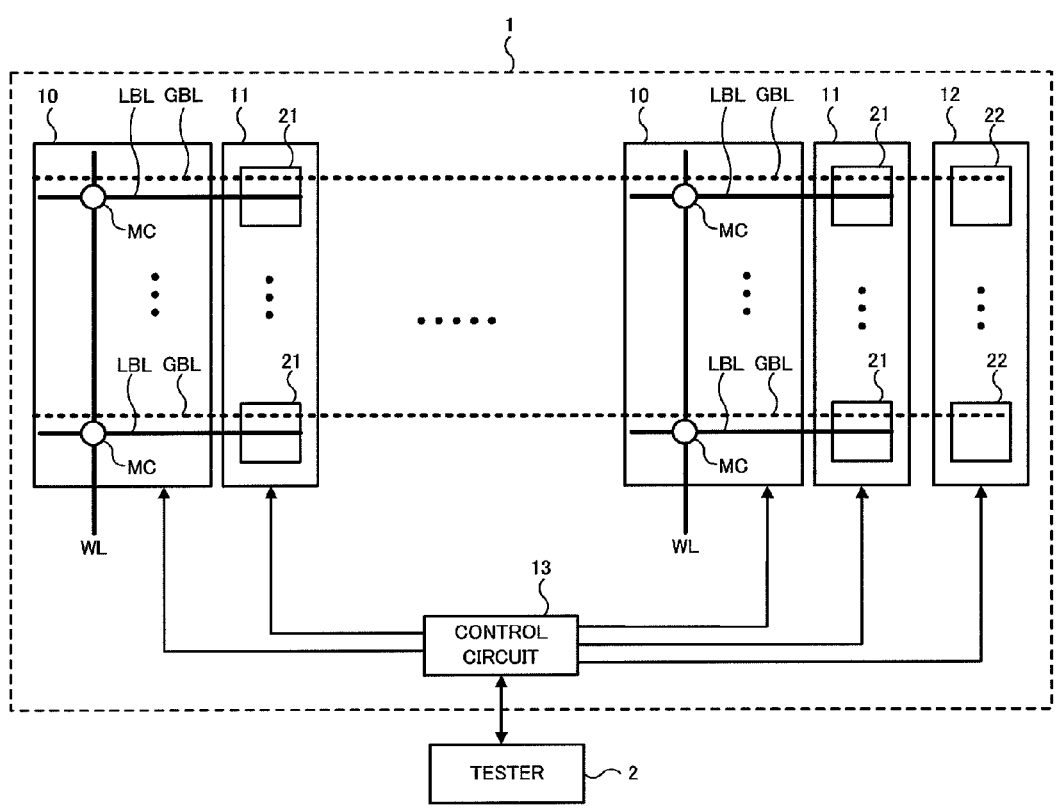
FIG. 1 is a diagram 1 showing an entire configuration of a DRAM 1 of a first embodiment.

FIG. 1 shows an entire configuration of a DRAM 1 of a first embodiment. In FIG. 1, a DRAM 1 including a plurality of memory cell arrays 10, a plurality of rows of local sense amplifiers 11, one row of global sense amplifiers 12 and a control circuit 13 is shown, and a tester 2 performing tests for the DRAM 1 is also shown.

Each memory cell array 10 includes a plurality of memory cells MC formed at all intersections of a plurality of word lines WL and a plurality of local bit lines LBL (the first bit lines of the invention) intersecting therewith. Although some memory cells MC are illustrated in FIG. 1, when arranging M word lines WL and N local bit lines LBL in one memory cell array 10, for example, M×N memory cells MC are included in the memory cell array 10. Further, L memory cell arrays 10 are included in the whole area of FIG. 1, over which N global bit lines GBL (the second bit lines of the invention) entirely extend, and L local bit lines LBL are arranged in parallel to each global bit line GBL corresponding to partitioning of the global bit line GBL.

Each row of local sense amplifiers 11 is arranged adjacent to each memory cell array 10, and includes N local sense amplifiers 21 (the first sense amplifier circuits of the invention) connected to the N local bit lines LBL. Each memory cell array 10 and each row of local sense amplifiers 11 form a pair, and respective pairs are repeatedly arranged in a bit line extending direction. Each local sense amplifier 21 amplifies a signal which is read out from a memory cell MC corresponding to a selected word line WL and transmitted to a local bit line LBL.

Each row of global sense amplifiers 12 is arranged at one end of a range where the plurality of memory cell arrays 10 and the plurality of rows of local sense amplifiers 11 are arranged in the bit line extending direction. The row of global sense amplifiers 12 includes N global sense amplifiers 22 (the second sense amplifier circuits of the invention) connected to the N global bit lines GBL. Each global sense amplifier 22 further amplifies the signal transmitted from the local sense amplifier 21 to the global bit line GBL.

In this manner, a hierarchical bit line structure and a hierarchical sense amplifier structure are employed in the DRAM 1 of the first embodiment. That is, L local bit lines LBL are corresponded to one global bit line GBL, L local sense amplifiers 21 are corresponded to one global sense amplifier 22. Thereby, an increase in the number of memory cells connected to one local bit line LBL can be suppressed, and small-scale single-ended local sense amplifier 21 circuits can be employed. Each global bit line GBL is capable of controlling reading/writing of data of a predetermined memory cell MC in a selected memory cell array 10.

Meanwhile, the control circuit 13 controls operations of the plurality of memory cell arrays 10, the plurality of rows of local sense amplifiers 11 and the plurality of rows of global sense amplifiers 12. The control circuit 13 sends control signals to various parts of the DRAM 1, and transmits various signals required in a test mode to/from the tester 2. The tester 2 starts the test mode in manufacturing the DRAM 1, and sends a predetermined command with necessary address and data to the control circuit 13 of the DRAM 1. In the first embodiment, tests performed for the DRAM 1 includes a measurement test of threshold voltages of MOS transistors included in the local sense amplifier 21, which will be described in detail.

Figure 2:
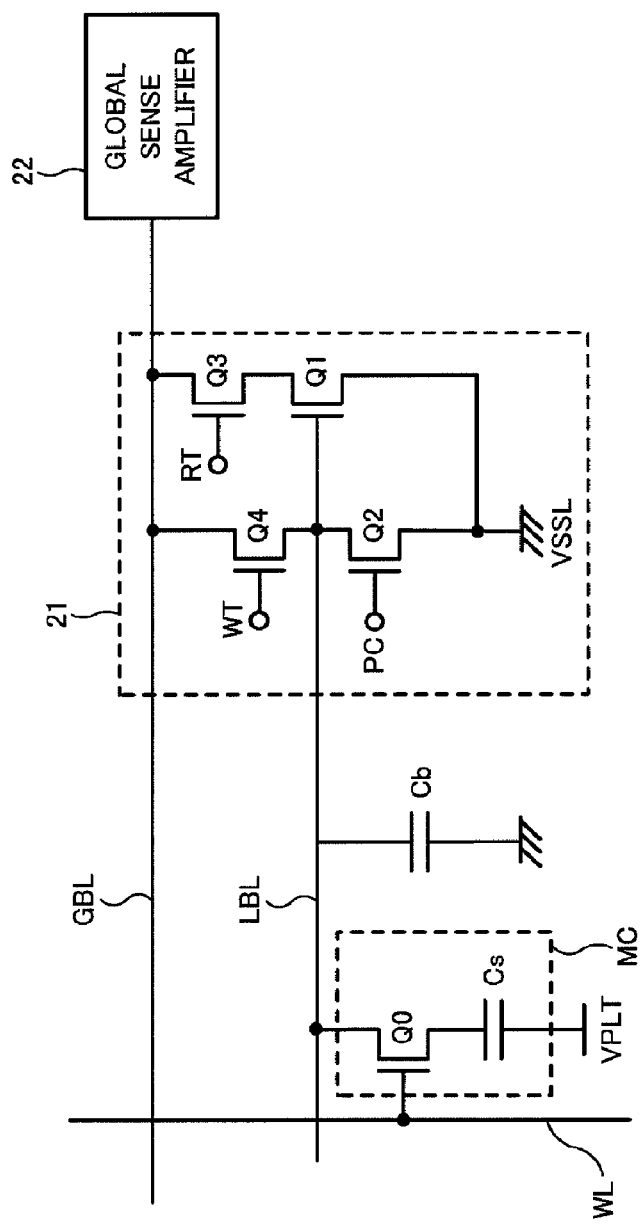
FIG. 2 is a diagram for explaining a specific configuration of a local sense amplifier 21 of FIG. 1 and its peripheral part.

Next, a specific configuration of the local sense amplifier 21 and its peripheral part in FIG. 1 will be described. FIG. 2 shows an example of a circuit configuration in FIG. 1, which corresponds to an area including one word line WL, one local bit line LBL, one memory cell MC arranged at an intersection thereof, one local sense amplifier 21, one global bit line GBL, and one global sense amplifier 22. As shown in FIG. 2, the memory cell MC is composed of an NMOS transistor Q0 and a capacitor Cs, and the local sense amplifier 21 is composed of four NMOS transistors Q1, Q2, Q3 and Q4.

The NMOS transistor Q0 of the memory cell MC has a gate connected to the word line WL, a source connected to the local bit line LBL, and a drain connected to one terminal of the capacitor Cs. The other terminal of the capacitor Cs is connected to a line of a cell plate voltage VPLT. Although FIG. 2 shows only one memory cell MC, a plurality of memory cells MC are practically connected to each local bit line LBL. Thereby, a parasitic capacitance Cb is formed at each local bit line LBL, as shown in FIG. 2.

In the local sense amplifier 21, two NMOS transistors Q3 and Q1 are connected in series between the global bit line GBL and a ground potential VSSL (the first ground potential of the invention). The NMOS transistor Q1 (the amplifying element of the invention) has a gate connected to the local bit line LBL, and amplifies the signal voltage of the local bit line LBL so as to convert it into a drain current. The NMOS transistor Q3 (the switch circuit of the invention) switches connection between the drain of the NMOS transistor Q1 and the global bit line GBL in response to a control signal RT inputted to the gate of the NMOS transistor Q3.

Further, two NMOS transistors Q4 and Q2 are connected in series between the global bit line GBL and the ground potential VSSL, and an intermediate node therebetween is connected to the local bit line LBL. The NMOS transistor Q2 (the first precharge circuit of the invention) precharges the local bit line LBL in response to a precharge signal PC inputted to the gate. When the precharge signal PC is controlled to be high, the local bit line LBL is precharged to the ground potential VSSL. The NMOS transistor Q4 switches connection between the local bit line LBL and the global bit line GBL in response to a control signal WT inputted to the gate.

The feature of the first embodiment is that sources of NMOS transistors Q1 and Q2 included in the local sense amplifier 21 are connected to the ground potential VSSL and are separated from ground potentials (for example, a ground potential VSS in FIG. 3) of other circuit portions. The ground potential VSSL is connected to a pad (terminal) different from pads for other ground potentials and can be externally connected independently. Then, in a test operation, by measuring a current flowing along a path passing through the ground potential VSSL, variation of the threshold voltage of the local sense amplifier 21 is determined, which will be described in detail. In addition, although FIG. 2 shows only one local sense amplifier 21, N local sense amplifiers 21 are actually provided in the memory cell array 10, and therefore it is possible to measure the total current by connecting sources of the NMOS transistors Q1 and Q2 of the N local sense amplifiers 21 commonly to the ground potential VSSL.

Figure 3:
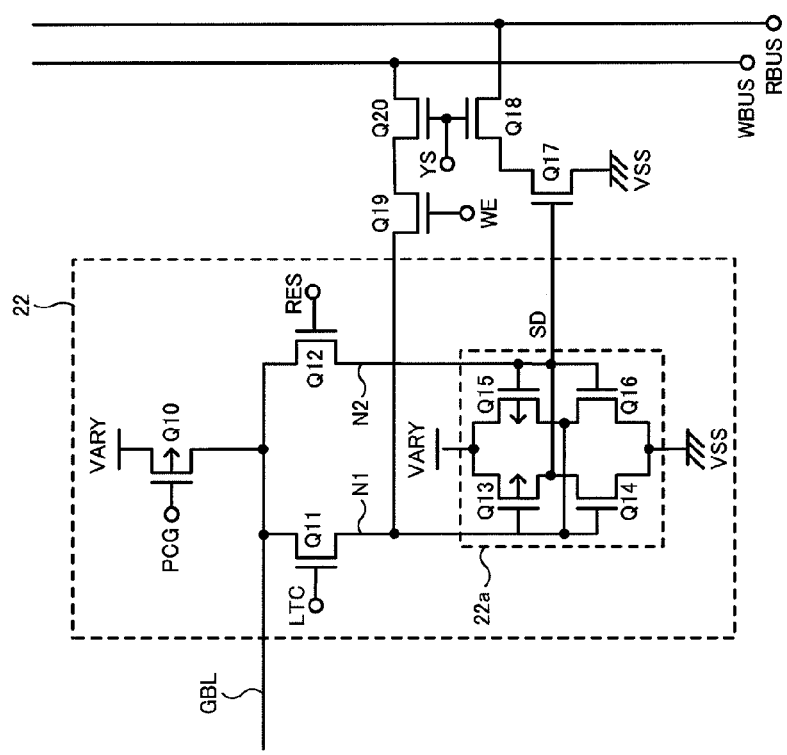
FIG. 3 is a diagram showing an example of a circuit configuration of a global sense amplifier 22 of FIG. 1.

FIG. 3 shows an example of a circuit configuration of the global sense amplifier 22 of FIG. 1. As shown in FIG. 3, the global sense amplifier 22 includes a PMOS transistor Q10, two NMOS transistors Q11 and Q12, and a signal voltage decision latch 22a. Further, two NMOS transistors Q17 and Q18 are provided between the global sense amplifier 22 and a read bus RBUS, and two NMOS transistors Q19 and Q20 are provided between the global sense amplifier 22 and a write bus WBUS.

The PMOS transistor Q10 is connected between a power supply voltage VARY and the global bit line GBL, and precharges the global bit line GBL in response to a precharge signal PCG inputted to the gate. When the precharge signal PCG is controlled to be low, the global bit line GBL is precharged to the power supply voltage VARY. The NMOS transistor Q11 switches connection between the global bit line GBL and a node N1 in response to a control signal LTC applied to the gate. The NMOS transistor Q12 switches connection between the global bit line GBL and a node N2 in response to a control signal RES applied to the gate.

The signal voltage decision latch 22a includes a PMOS transistor Q13 and an NMOS transistor Q14, which form a sensing inverter, and includes a PMOS transistor Q15 and an NMOS transistor Q16, which form a latching inverter. The signal voltage decision latch 22a determines a binary level of a signal transmitted from the global bit line GBL to the node N1 via the NMOS transistor Q11 and latches the signal, and outputs an output signal SD obtained by logically inverting the global bit line GBL to the node N2. In the signal voltage decision latch 22a, sources of the PMOS transistor Q13 and Q15 are connected to the power supply voltage VARY, and sources of the NMOS transistors Q14 and Q16 are connected to the ground potential VSS.

In a read operation, the control signal LTC becomes high and a selection signal YS becomes high, and the output signal SD at the node N2 is inputted to the gate of the NMOS transistor Q17 and is outputted to the read bus RBUS via series connected NMOS transistors Q17 and Q18. In a rewrite operation to the memory cell MC after the read operation, the control signal LTC becomes low and the control signal RES becomes high, and the output signal SD is outputted to the global bit line GBL via the NMOS transistor Q12.

Meanwhile, in a write operation, the selection signal YS becomes high and the control signal WE becomes high, write data is inputted through the write bus WBUS. The write data reaches the node N1 via the NMOS transistors Q20 and Q19, inverted by the above sensing inverter of the signal voltage decision latch 22a, and outputted to the global bit line GBL via the NMOS transistor Q12.

Figure 4:
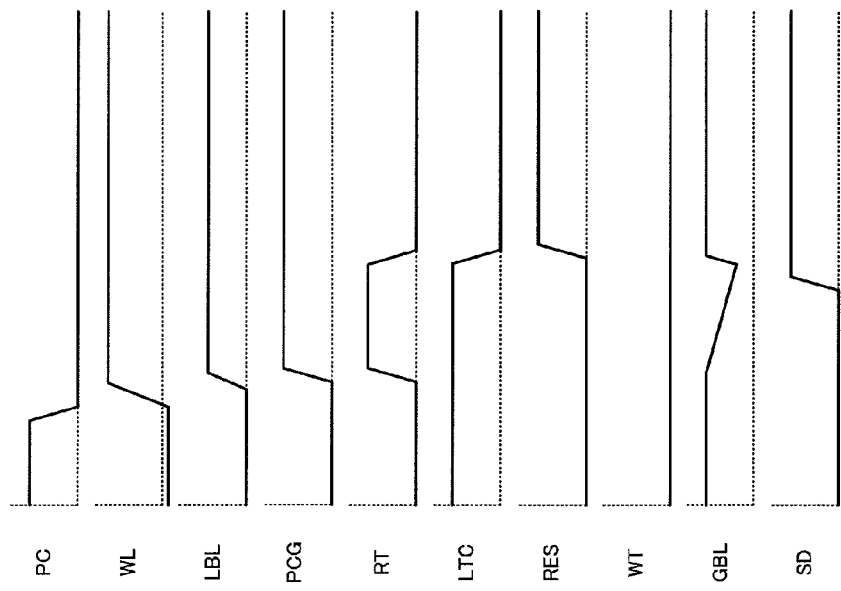
FIG. 4 is a diagram showing signal waveforms of the DRAM 1 of the first embodiment in a normal read operation.
Figure 5:
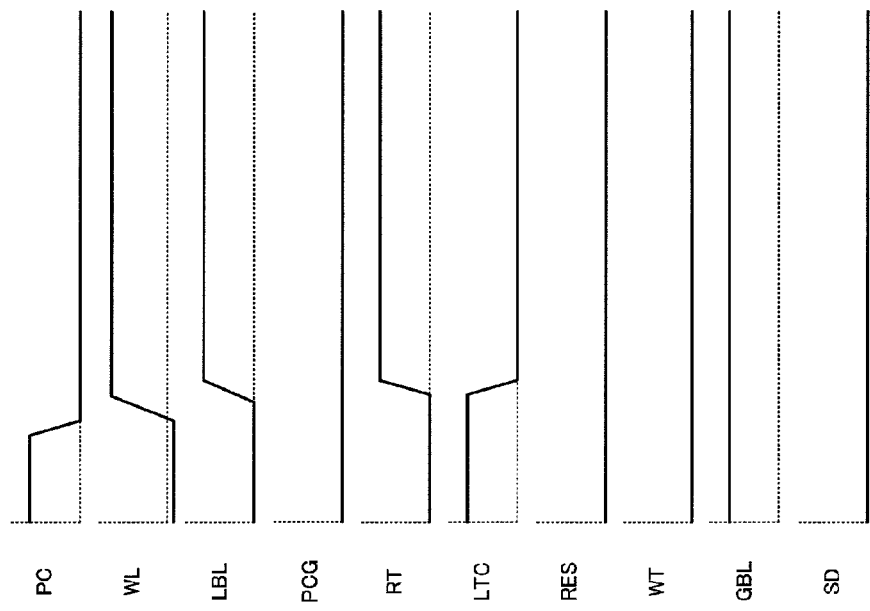
FIG. 5 is a diagram showing signal waveforms of the DRAM 1 of the first embodiment in a test operation.

Next, the operation of the DRAM 1 of the first embodiment will be described using FIGS. 4 and 5. FIG. 4 shows signal waveforms of the DRAM 1 in a normal read operation, and FIG. 5 shows signal waveforms of the DRAM 1 in a test operation. In a state where the memory cell MC is maintained high at an initial time period in FIG. 4, the precharge signal PC is maintained high and the local bit line LBL has been precharged to the ground potential VSSL. Then, when the control circuit 13 receives an ACT command, the precharge signal PC is controlled to be low, and the precharge state of the local bit line LBL is cancelled. Subsequently, when a selected word line WL is driven to high, high level data stored in the memory cell MC is read out to the local bit line LBL. At this point, the potential of the local bit line LBL is increased to a level determined by a ratio of a capacitance of the capacitor Cs and the parasitic capacitance Cb at the local bit line LBL. Thereby, the NMOS transistor Q1 of the local sense amplifier 21 is turned on.

At this point, the control signal RT is controlled to be high, the precharge signal PCG is controlled to be high, and the precharge state of the global bit line GBL, which has been precharged to the power supply voltage VARY, is cancelled. Thereby, the electric charge charged in the global bit line GBL is extracted via the NMOS transistors Q3 and Q1, and the potential of the global bit line GBL is reduced. Then, the signal voltage decision latch 22a of the global sense amplifier 22 operates so that the output signal SD at the node N2 is inverted to change to high from low. By this operation, the high level data can be read out from the memory cell MC.

In the test operation of FIG. 5, high level data has been previously written into N memory cells MC to be read out. Then, after moving to the test mode, when the control circuit 13 receives a command for testing, the precharge signal PC is controlled to be low so that the precharge state of the local bit line LBL is cancelled. Subsequently, when a selected word line WL is driven to high, high level data to be read stored in the N memory cells MC is read out and transmitted to the N local bit lines LBL. Thereby, respective NMOS transistors Q1 of the N local sense amplifiers 21 are turned on.

At this point, the control signal RT is controlled to be high, while at the same time the precharge signal PCG is maintained low. Therefore, current flows from the global bit line GBL which is in a state of receiving the power supply voltage VARY via the PMOS transistor Q10, and the current flows to the ground potential VSSL via the NMOS transistors Q3 and Q1. Since a sufficiently high voltage is applied to the gate of the NMOS transistor Q1 from the local bit line LBL, an on-resistance of the NMOS transistor Q1 is sufficiently smaller than on-resistances of the PMOS transistor Q10 and the NMOS transistor Q3. Thus, the current flowing from the power supply voltage VARY to the ground potential VSSL via the PMOS transistor Q10 and the NMOS transistors Q3 and Q1 is limited by driving ability of the NMOS transistor Q1. As a result, a total current flowing from the power supply voltage VARY to the ground potential VSSL in the entire N local sense amplifiers 21 is N times the drain current Id flowing in each NMOS transistor Q1.

The total current at this point is measured by the tester 2 connected to a pad of the ground potential VSSL, and 1/N of the current value is calculated as the drain current Id. Here, the following formula is satisfied for the drain current Id.

$$Id = K \cdot (Wg/Lg) \cdot (Vgs - Vt)^2 \qquad (1)$$

K: coefficient dependent on process
Wg: effective gate width
Lg: effective gate length
Vt: threshold voltage
Vgs: gate-to-source voltage Accordingly, the threshold voltage Vt is obtained by the following formula.

$$Vt = Vgs - \sqrt{Id} \cdot \sqrt{(1/K) \cdot (Lg/Wg)} \qquad (2)$$

Due to the above formulas, a reference value for variation of the threshold voltage of the NMOS transistor Q1 can be obtained. Although a case of measuring the current through the pad of the ground potential VSSL has been described in the first embodiment, the invention can be applied to another case where the ground potential VSSL and other ground potentials are connected to a common pad. In this case, concerning the N local sense amplifiers 21, the threshold voltage Vt for a case of not performing the amplifying operation can be calculated similarly as described above by obtaining an increase in current value for a case of performing the amplifying operation.

Figure 6:
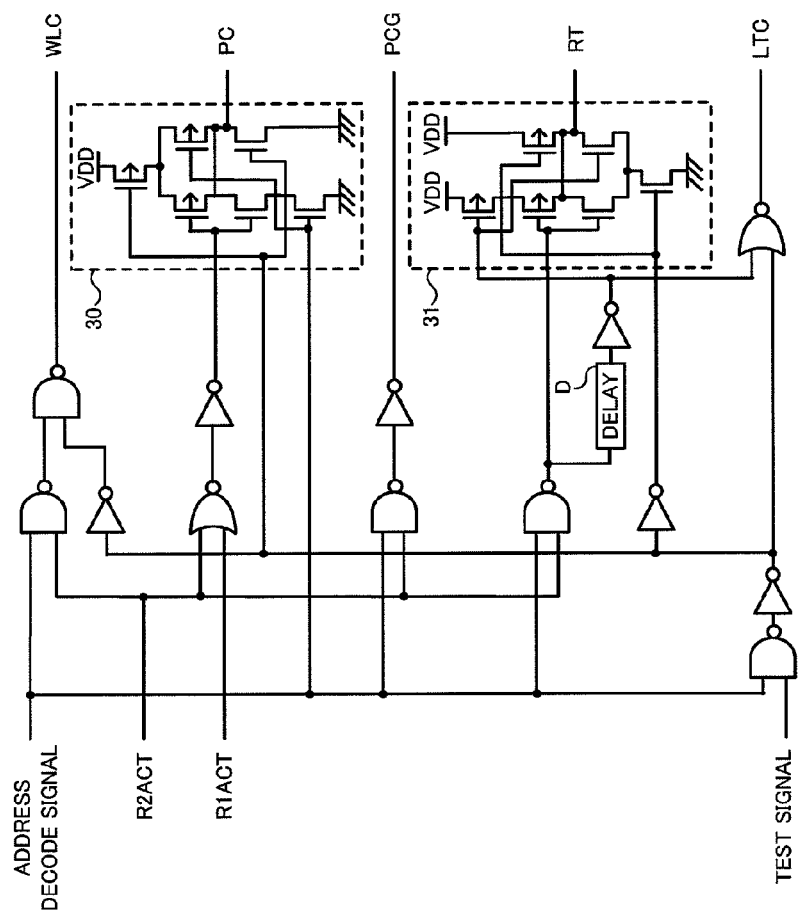
FIG. 6 is a diagram showing a circuit configuration example of a main part in a control circuit 13 of the first embodiment.
Figure 7:
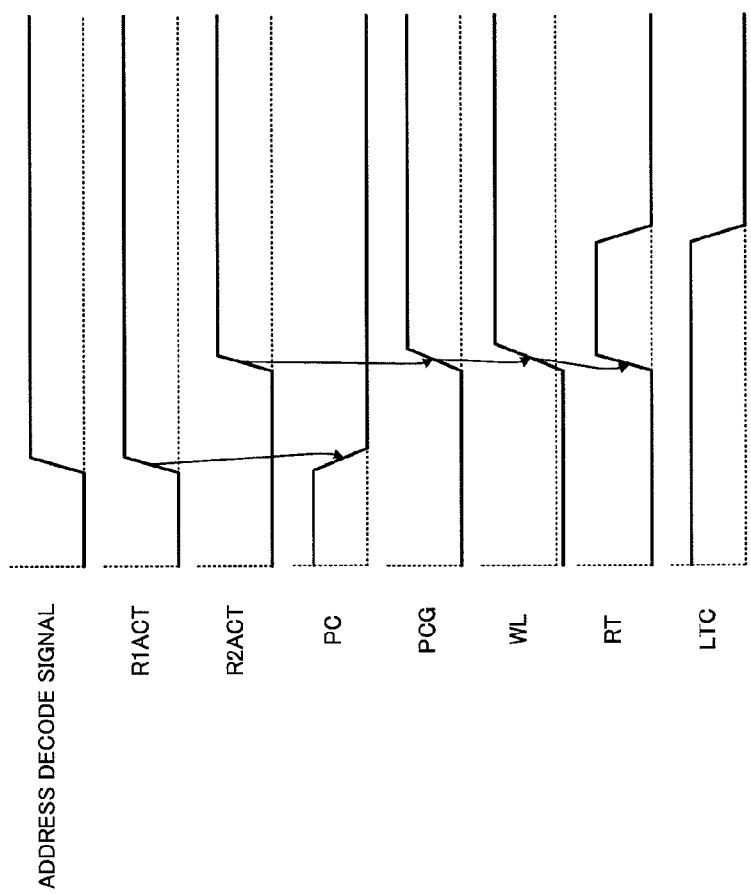
FIG. 7 is a diagram showing operation waveforms at various points in FIG. 6 corresponding to the read operation of FIG. 4.
Figure 8:
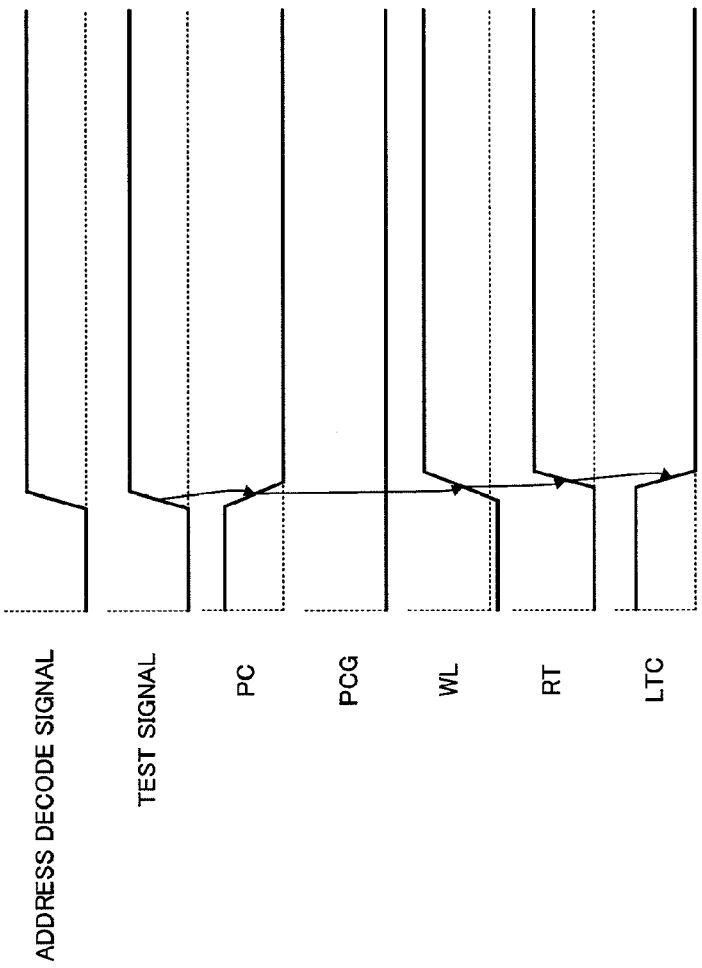
FIG. 8 is a diagram showing operation waveforms at various points in FIG. 6 corresponding to the test operation of FIG. 5.

Next, configuration and operation of the control circuit 13 for controlling the operation in FIGS. 4 and 5 will be described. FIG. 6 shows a circuit configuration example of a main part of the control circuit 13, FIG. 7 shows operation waveforms at various points in FIG. 6 corresponding to the read operation of FIG. 4, and FIG. 8 shows operation waveforms at various points in FIG. 6 corresponding to the test operation of FIG. 5. As shown in FIG. 6, the control circuit 13 includes a logic circuit composed of inverters, NAND gates, NOR gates and a delay element D, and includes two signal latches 30 and 31. In the configuration of FIG. 5, a word line control signal WLC, precharge signals PC and PCG and control signals RT and LTC are generated and outputted based on an address decode signal, control signals R1ACT and R2ACT, and a test signal, which are inputted to the logic circuit.

In the read operation, as shown in FIG. 7, the address decode signal of FIG. 6 is inputted and controlled to be high, and the control signal R1ACT is controlled to be high at the same time. Thereby, the precharge signal PC changes from high to low in order to cancel the precharge state of the local sense amplifier 21. Thereafter, when the control signal R2ACT is controlled to be high, the precharge signal PCG changes from low to high in order to cancel the precharge state of the global sense amplifier 22. At the same time, the word line WL becomes high in association with the word line control signal WLC and the control signal RT becomes high. Then, after a predetermined time corresponding to a delay of the delay element D of FIG. 6 elapses, the control signal RT returns to low and the control signal LTC changes from high to low.

Meanwhile, in the test operation, as shown in FIG. 8, the address decode signal of FIG. 6 is inputted and controlled to be high, and the test signal is inputted and controlled to be high. Thereby, the precharge signal PC changes from high to low in the same manner as FIG. 7, while the precharge signal PCG is maintained low. Accordingly, the test operation described using FIG. 5 can be achieved. At this point, the word line WL becomes high, the control signal RT changes from low to high, and the control signal LTC changes from high to low. Thereafter, the states of the above signals are maintained until the test operation is completed.

Second Embodiment

Figure 9:
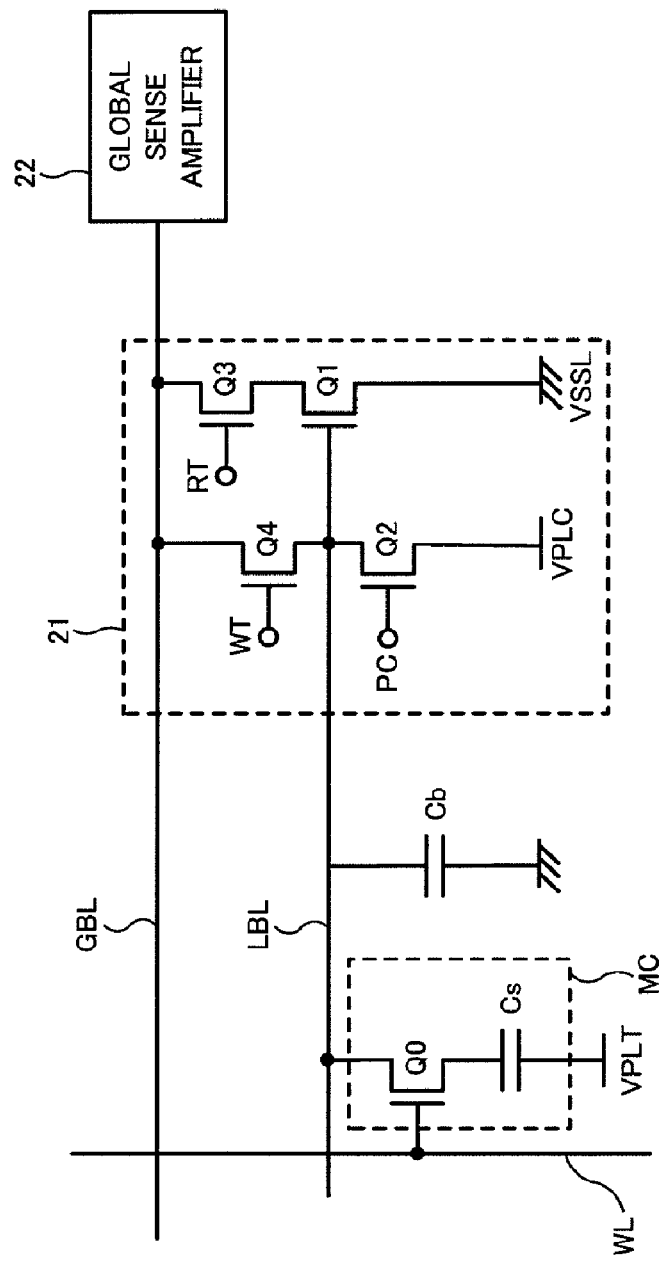
FIG. 9 is a diagram for explaining a specific configuration of a local sense amplifier 21 of the second embodiment and its peripheral part.

Next, the DRAM 1 of a second embodiment will be described. An entire configuration of the DRAM 1 of the second embodiment is common to that of the first embodiment shown in FIG. 1, so description thereof will be omitted. FIG. 9 shows a specific configuration of the local sense amplifier 21 of the second embodiment and its peripheral part. Although the circuit configuration in FIG. 9 is almost common to that of the first embodiment, a difference exists in that a control voltage VPLC is applied to the source of the NMOS transistor Q2 (the second precharge circuit of the invention) of the local sense amplifier 21. In addition, other points are the same as in FIG. 2, and the global sense amplifier 22 is also configured in the same manner as FIG. 3, so description thereof will be omitted.

In the second embodiment, when the precharge signal PC is controlled to be high, the local bit line LBL is precharge to the control voltage VPLC. In this case, the control voltage VPLC can be set to an arbitrary voltage value, which is different from the first embodiment. Accordingly, in the second embodiment, a desired voltage depending on the control voltage VPLC can be applied to the gate of the NMOS transistor Q1, without reading out the memory cell MC to the local bit line LBL by driving the word line WL, and thus the test for the threshold voltage of the local sense amplifier 21 can be performed under a desired condition.

Figure 10:
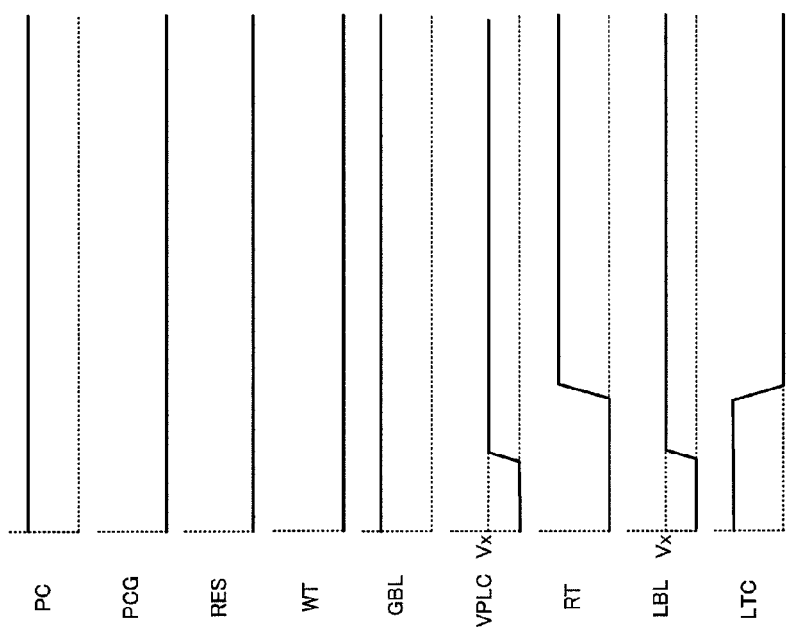
FIG. 10 is a diagram showing signal waveforms of the DRAM 1 of the second embodiment in a test operation.

FIG. 10 shows signal waveforms of the DRAM 1 in a test operation in the second embodiment. As shown in FIG. 10, the DRAM 1 is maintained in a standby state, the precharge signal PC is maintained high, the precharge signal PCG is maintained low, and both the control signals RES and WT are maintained low. Further, since the control voltage VPLC (the ground potential VSSL) is controlled to be low at an initial time period, the local bit line LBL has been precharged to the ground potential VSSL. From this state, when the control voltage VPLC is controlled to be a voltage Vx at a predetermined timing, the local bit line LBL is increased to the voltage Vx and the voltage Vx is applied to the gate of the NMOS transistor Q1. Thereafter, the control signal RT is controlled to be high, and the control signal LTC is controlled to be low. Thereby, current flows from the power supply voltage VARY to the ground potential VSSL via the PMOS transistor Q10 and the NMOS transistors Q3 and Q1. As a result, a total current flowing from the power supply voltage VARY to the ground potential VSSL in the entire N local sense amplifiers 21 is N times the drain current Id flowing in each NMOS transistor Q1. Measurement and calculation in the tester 2 are performed based on the above formulas (1) and (2) in the same manner as the first embodiment.

Figure 11:
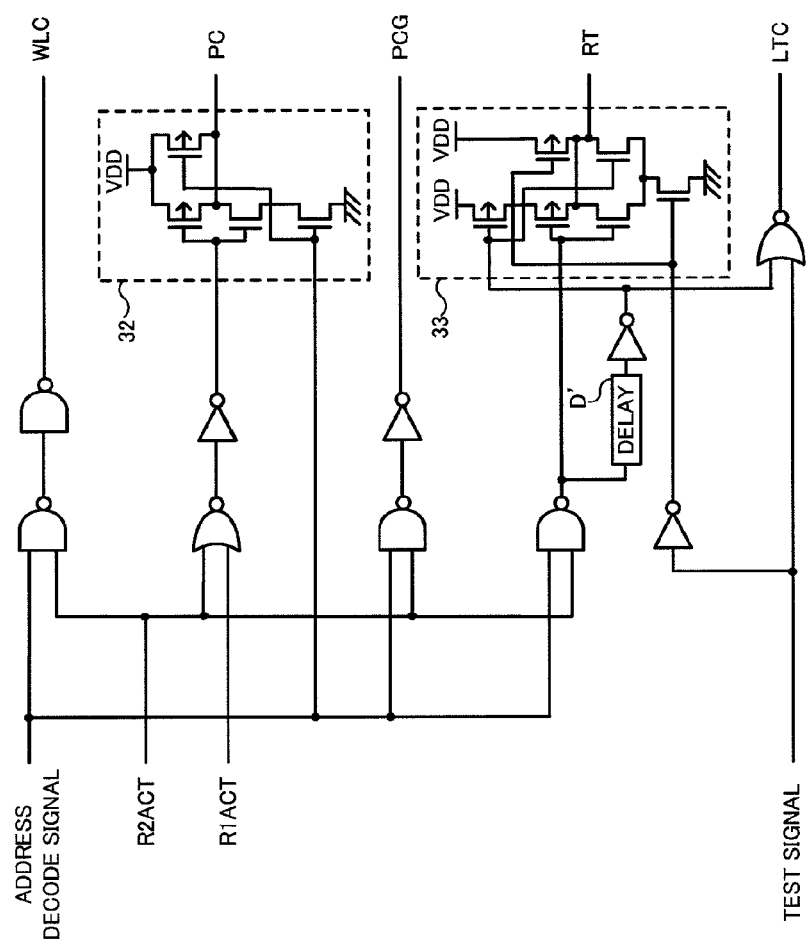
FIG. 11 is a diagram showing a circuit configuration example of a main part of a control circuit 13 of the second embodiment.

Next, configuration and operation of the control circuit 13 for controlling the operation in FIG. 10 will be described. FIG. 11 shows a circuit configuration example of a main part of the control circuit 13. As shown in FIG. 11, the control circuit 13 includes a logic circuit composed of inverters, NAND gates, NOR gates and a delay element D', and includes two signal latches 32 and 33. In the configuration of FIG. 11, the word line control signal WLC, the precharge signals PC and PCG, and the control signals RT and LTC are generated and outputted based on the address decode signal, the control signals R1ACT and R2ACT, and the test signal, which are inputted to the logic circuit. In FIG. 11, the test signal of high level is inputted at a timing to start the test operation in FIG.

10, the control signal RT is controlled to be high, and the control signal LTC is controlled to be low.

In the foregoing, contents of the present invention have been specifically described based on the embodiments, however the present invention is not limited to the above described embodiments and can variously be modified without departing the essentials of the present invention. For example, the above embodiments have described the configuration in which the predetermined number of local bit lines LBL are selectively connected to the global bit line GBL in the hierarchical memory cell array 10. However, the present invention can be widely applied to various configurations in which the first bit line is connected to the single-ended first sense amplifier circuit.

What is claimed is:

1. A semiconductor memory device, comprising:
a memory cell array including a plurality of memory cells;
a first bit line through which a signal read out from a selected memory cell of the memory cell array is transmitted;
a first sense amplifier circuit of single-ended configuration including an amplifying element amplifying a signal voltage of the first bit line so as to convert the signal voltage into an output current; and
a control circuit controlling a test operation to measure a current flowing in the first sense amplifier circuit independently of currents flowing in other circuit portions,
wherein a plurality of the first bit lines and a plurality of the first sense amplifier circuits are provided, and the control circuit controls the test operation to measure a total current flowing in the first sense amplifier circuits, and
wherein the plurality of the first sense amplifier circuits are connected to a first ground potential which is independent from ground potentials connected to other circuit portions, and the first ground potential is capable of being externally connected via a terminal.

2. The semiconductor memory device according to claim 1, wherein the amplifying element is an NMOS transistor having a gate connected to the first bit line and a source connected to the first ground potential, and a drain current as the output current flows therein corresponding to a potential of the first bit line.

3. The semiconductor memory device according to claim 1, wherein each of the first sense amplifier circuits includes a first precharge circuit precharging the first bit line to the first potential.

4. A test method of a semiconductor memory device comprising: a memory cell array including a plurality of memory cells; a plurality of first bit lines through which a signal read out from a selected memory cell of a memory cell array including a plurality of memory cells is transmitted; a plurality of first sense amplifier circuits of single-ended configuration including amplifying elements each amplifying a signal voltage of the first bit line so as to convert the signal voltage into an output current; and a control circuit controlling a test operation to measure a current flowing in each of the first sense amplifier circuits independently of currents flowing in other circuit portions,
the method comprising:
transmitting signals read out from N (N is an integer greater than two) memory cells through N first bit lines;
amplifying signal voltages of the N first bit lines by N first sense amplifier circuits;
measuring a total current flowing in all of the N first sense amplifier circuits; and
calculating an average value of threshold voltages of the amplifying elements based on the measured total current.

5. A test method of the semiconductor memory device according to claim 4, the method further comprising:
precharging N first bit lines to the predetermined control voltage by N second precharge circuits.

6. A semiconductor device comprising:
a first transistor receiving an output signal from a memory cell and provided between a first voltage node and a first signal node;
a second transistor provided between the first signal node and a second voltage node which is different in voltage potential from the first voltage node; and
a control circuit which renders the second transistor conductive while the first transistor is being turned ON in response to the output signal from the memory cell in the test mode and renders the second transistor nonconductive while the first transistor is being turned ON in response to the output signal from the memory cell in a normal mode.

7. The semiconductor device according to claim 6, wherein the second voltage node is larger in voltage potential than the first voltage node, the first transistor is an NMOS transistor, and the second transistor is a PMOS transistor.

8. The semiconductor device according to claim 6, further comprising:
a third transistor receiving another output signal from another memory cell and provided between a third voltage node electrically connected to the first voltage node and a second signal node; and
a fourth transistor provided between the second signal node and a fourth voltage node which is a different voltage potential from the third voltage node, and the fourth voltage node being electrically connected to the second voltage node;
wherein the control circuit renders the fourth transistor conductive while the third transistor is being turned ON in response to the another output signal from the another memory cell in the test mode and renders the fourth transistor nonconductive while the third transistor is being turned ON in response to the another output signal from the another memory cell in the normal mode.

9. The semiconductor device according to claim 8, further comprising:
a first pad supplied with a first voltage, supplying the first voltage to each of the first and third voltage nodes; and
a second pad supplied with a second voltage equal in voltage potential to the first voltage and electrically disconnected from the first pad.

10. The semiconductor device according to claim 6, wherein the control circuit renders the second transistor conductive before the first transistor is turned ON in response to the output signal from the memory cell in each of the test and normal modes.

* * * * *